United States Patent
Herner et al.

(10) Patent No.: US 6,429,126 B1
(45) Date of Patent: Aug. 6, 2002

(54) REDUCED FLUORINE CONTAMINATION FOR TUNGSTEN CVD

(75) Inventors: Scott Brad Herner, Palo Alto; Sandeep A. Desai, San Jose, both of CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/538,379

(22) Filed: Mar. 29, 2000

(51) Int. Cl.$^7$ ................................. H01L 21/44

(52) U.S. Cl. .......................... 438/680; 438/656

(58) Field of Search ...................... 438/680, 683, 438/906, 677, 682, 685, 648, 643, 645, 672, 627, 629, 653, 656, 674

(56) References Cited

U.S. PATENT DOCUMENTS

| | | | | |
|---|---|---|---|---|
| 4,851,369 A | * | 7/1989 | Ellwanger et al. | 437/200 |
| 4,968,644 A | * | 11/1990 | Gallagher et al. | 437/192 |
| 5,028,565 A | * | 7/1991 | Chang et al. | 437/192 |
| 5,231,055 A | * | 7/1993 | Smith | 437/192 |
| 5,231,056 A | * | 7/1993 | Sandhu et al. | 437/200 |
| 5,407,698 A | * | 4/1995 | Emesh | 427/99 |
| 5,482,749 A | * | 1/1996 | Telford et al. | 427/578 |
| 5,654,234 A | * | 8/1997 | Shih et al. | 438/643 |
| 5,795,824 A | * | 8/1998 | Hancock | 438/656 |
| 5,906,866 A | * | 5/1999 | Webb | 427/534 |
| 5,956,609 A | * | 9/1999 | Lee et al. | 438/627 |
| 6,020,254 A | * | 2/2000 | Taguwa | 438/618 |
| 6,049,131 A | * | 4/2000 | Brodsky et al. | 257/763 |
| 6,090,706 A | * | 7/2000 | Telford et al. | 438/680 |
| 6,265,312 B1 | * | 7/2001 | Sidhwa et al. | 438/685 |

OTHER PUBLICATIONS

S.B. Herner et al., ""Volcano" Reactions in Oxide Vias Between Tungsten CVD and Bias Sputtered TiN/Ti Films," *Journal of the Electrochemical Society*, vol. 147, No. 5, pp. 1982–1987 (2000).

G. Ramanath et al., "Gas–phase Transport of $WF_6$ Through Annular Nanopipes in TiN During Chemical Vapor Deposition of W on $TiN/SiO_2$ Structures For Integrated Circuit Fabrication," *Appl. Phys. Lett.*, vol. 69, No. 21, pp. 3179–3181 (Nov. 1996).

E.J. McInerney et al., "Silane Reduced Chemical Vapor Deposition Tungsten as a Nucleating Step in Blanket W," *J. Vac. Sci. Technol. B.*, vol. 11, No. 3, pp. 734–743 (May/Jun. 1993).

Arun K. Nanda et al., "Characterization of the Nucleation and Growth Process of CVD–W on TiN Substrates," *Mat. Res. Soc. Symp. Proc.*, vol. 382, pp. 401–406 (1995).

(List continued on next page.)

*Primary Examiner*—Hoai Ho
*Assistant Examiner*—David Vu
(74) *Attorney, Agent, or Firm*—Townsend & Townsend & Crew

(57) ABSTRACT

A chemical vapor deposition process for depositing a tungsten film on a substrate disposed in a substrate processing. The method includes depositing nucleation and bulk deposition tungsten layers. The nucleation layer is deposited by flowing a first process gas comprising tungsten hexafluoride, silane, molecular hydrogen and argon into said substrate processing chamber, where the flow ratio of molecular hydrogen to argon is at least 1.5:1 and the partial pressure of tungsten hexafluoride is less than or equal to 0.5 Torr. The bulk deposition layer is then deposited over the nucleation layer by flowing a second process gas comprising tungsten hexafluoride and a reduction agent into the substrate processing chamber.

17 Claims, 6 Drawing Sheets

OTHER PUBLICATIONS

S.B. Herner et al., "Homogeneous Tungsten Chemival Vapor Deposition on Silane Pretreated Titanium Nitride," *Electrochemical and Solid–State Letters*, vol. 2, No. 8, pp. 398–400 (1999).

S.B. Herner et al., ""Volcano" Reactions and Step Coverage in Oxide Vias With Tungsten CVD and Bias Sputtered TiN/Ti Films," submitted to the *Journal of the Electrochemical Society*, pp. 1–11 (publication date unknown).

* cited by examiner under pressure and the partial pressure of WF6 is held

REDUCED FLUORINE CONTAMINATION FOR TUNGSTEN CVD

BACKGROUND OF THE INVENTION

The present invention relates to the fabrication of integrated circuits. More particularly, the invention provides a technique, including a method and apparatus, for depositing tungsten (W) films.

Deposition of tungsten over a semiconductor substrate is a common step in the formation of some integrated circuit (IC) structures. For example, tungsten deposited by a chemical vapor deposition (CVD) technique is commonly used to provide electrical contact to portions of a semiconductor substrate. These electrical contacts are usually provided through openings in an insulation layer, such as a silicon oxide layer, formed over the substrate. One common vertical interconnect film stack includes a titanium (Ti) film for the contact, followed by a thin titanium nitride (TiN) diffusion barrier film, and a thicker CVD tungsten film to fill the majority of the via and serve as the conducting film. Tungsten CVD provides excellent step coverage, particularly in high aspect ratio (HAR) vias, and a high deposition rate for the deposited tungsten film.

One CVD technique that has been employed to deposit tungsten films in the semiconductor industry uses tungsten hexafluoride ($WF_6$) and a hydrogen reducing agent, as precursor gases. One known process that uses this deposition technique includes two main steps: nucleation and bulk deposition. The nucleation step grows a thin layer of silane-reduced ($SiH_4$) tungsten which acts as a growth site for subsequent film. In addition to $WF_6$ and $SiH_4$, the process gas used in the nucleation step may include molecular hydrogen ($H_2$), nitrogen ($N_2$) and argon. A bulk deposition step is then used to form the tungsten film from a process gas including $WF_6$, $H_2$, $N_2$ and Ar.

As advances in integrated circuit technology lead to a scaling down of device dimensions and an increase in chip size and complexity, issues which were not previously considered problematic are becoming a concern. Once such issue is fluorine contamination during the tungsten deposition process. Fluorine contamination in a tungsten via is a consequence when $WF_6$ is used for tungsten CVD. Fluorine contamination in the film stack is undesirable due its' ability to increase resistivity of the films and its' reactivity with other elements, particularly titanium. Fluorine can also diffuse out of the via and into the transistor device during subsequent thermal processing. Increased fluorine levels in the gate oxide have been correlated with increased penetration of boron dopant in the gate oxide and channel regions with negative implications for device performance.

One method of reducing fluorine contamination in the titanium film is by increasing the thickness of the TiN diffusion barrier. However, this approach increases resistance in the via because of the higher resistivity of TiN relative to tungsten. Also, the TiN film may have reduced step coverage relative to tungsten CVD meaning a thicker TiN film may result in lower overall step coverage in the via. The continuing decrease in via diameter has made the use of thinner, not thicker, diffusion barriers desirable.

Accordingly, improvements in the deposition of tungsten films that result in reduced fluorine contamination are desirable.

SUMMARY OF THE INVENTION

The present invention provides a method and apparatus for forming an improved tungsten film having reduced fluorine contamination film. Embodiments of the invention result in minimal fluorine penetration into underlying liner/barrier films and can be used for via applications requiring void free, 100% step coverage.

One embodiment of the method of the present invention includes a chemical vapor deposition process for depositing a tungsten film on a substrate disposed in a substrate processing chamber. This embodiment includes depositing a first layer of the tungsten film by flowing a first process gas comprising tungsten hexafluoride, silane, molecular hydrogen and argon into the substrate processing chamber, where a flow ratio of the molecular hydrogen to argon is at least 1.5:1 and the partial pressure of tungsten hexafluoride is less than or equal to 0.5 Torr. The second layer of the tungsten film is then deposited over the first layer by flowing a second process gas comprising tungsten hexafluoride and a reduction agent into the substrate processing chamber.

These and other embodiments of the present invention, as well as its advantages and features are described in more detail in conjunction with the text below and attached figures.

DESCRIPTION OF THE SPECIFIC EMBODIMENTS

I. Introduction

Embodiments of the present invention allow for deposition of an improved tungsten film by flowing a relatively high ratio of hydrogen to argon into the chamber during deposition of a tungsten nucleation layer and keeping the partial pressure of $WF_6$ relatively low. The present inventors discovered that when a tungsten film is deposited in this manner, less fluorine contamination results in the underlying TiN/Ti film stack than it does if the tungsten film is deposited according to a previously known tungsten CVD process.

Films deposited by the method of the present invention are suitable for use in the fabrication of integrated circuits having feature sizes of 0.25 microns or less and can be used to completely fill vias and contacts having an aspect ratio of 8:1 with a 0.25 µm diameter opening in a void free manner. Also, the present invention can be used to deposit tungsten films in CVD chambers of conventional design.

II. Exemplary CVD Reactor Chamber

Figure 1A:
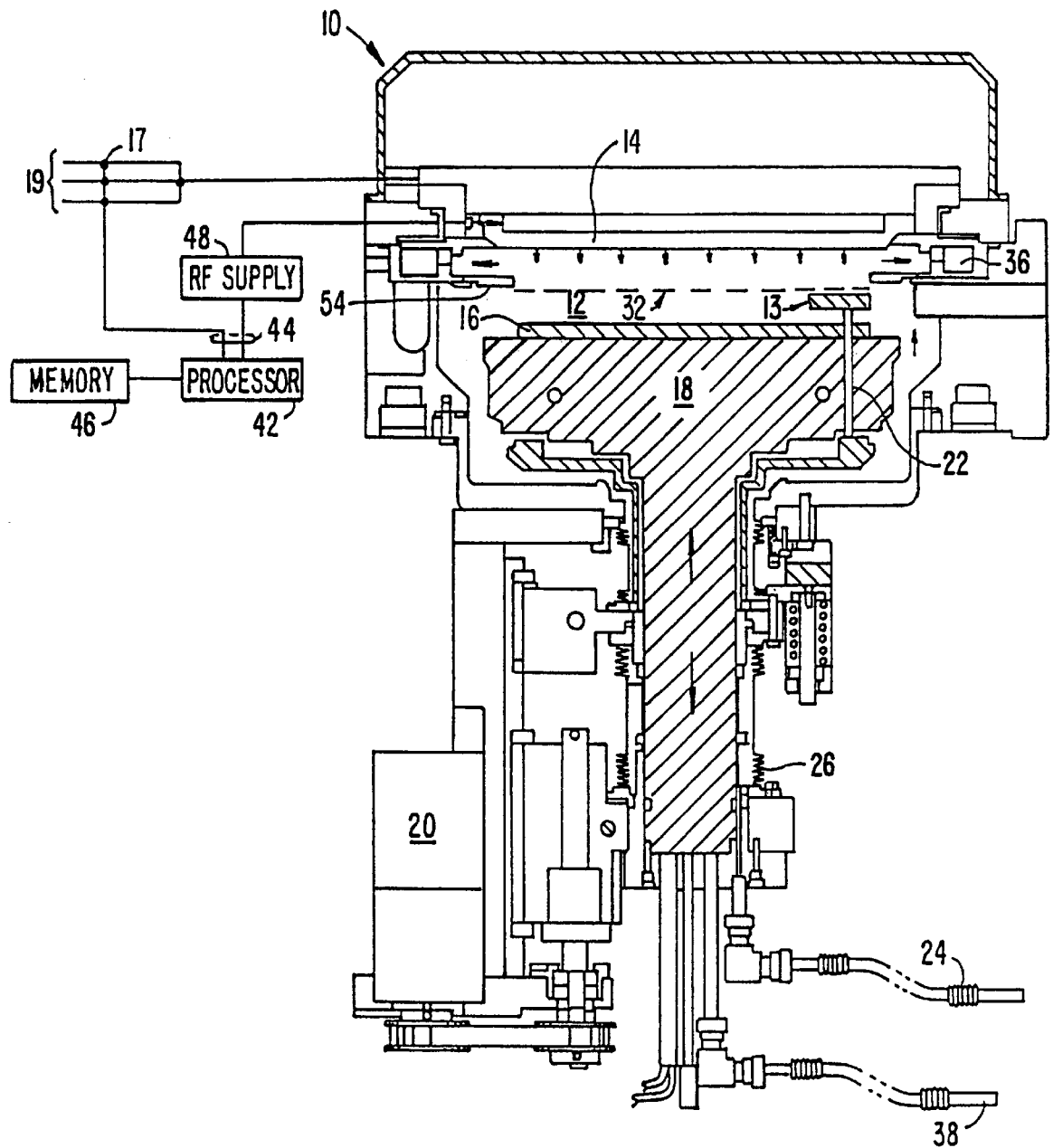
FIG. 1A is a vertical, cross-sectional view of one embodiment of a simplified chemical vapor deposition apparatus according to the present invention.
Figure 1B:
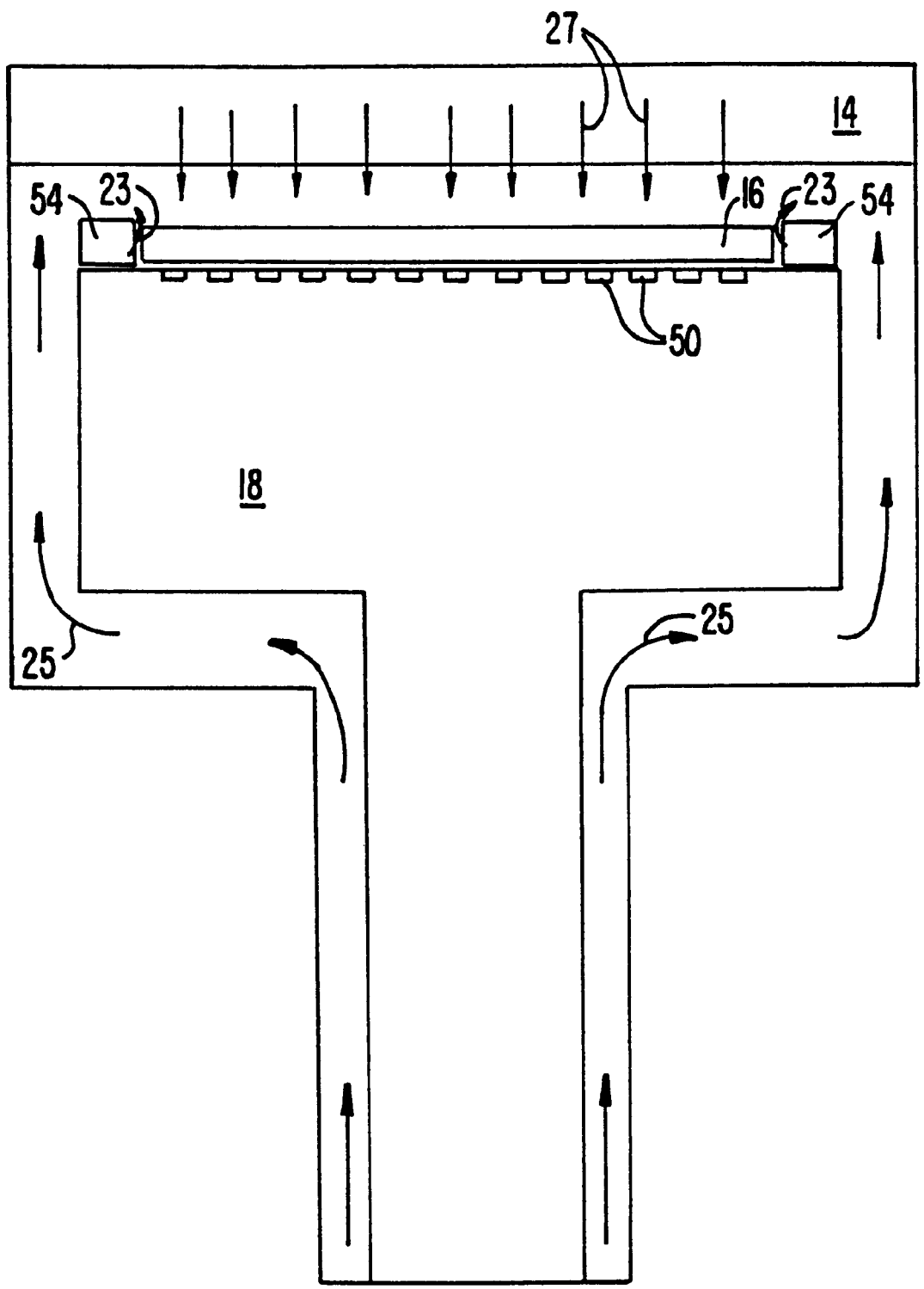
FIG. 1B is a vertical, cross-sectional view of one embodiment of a resistively heated susceptor used in the chamber of FIG. 1 to secure a substrate being processed in chamber.

FIGS. 1A and 1B illustrate one embodiment of a parallel plate, cold-wall chemical vapor deposition system 10 having a vacuum chamber 12 in which the tungsten film according to the present invention can be deposited. CVD System 10 contains a gas distribution manifold 14 for dispersing deposition gases to a wafer 16 that rests on a resistively-heated pedestal 18.

Chamber 12 may be part of a vacuum processing system having multiple processing chambers connected to a central transfer chamber and serviced by a robot. Substrate 16 is brought into chamber 12 by a robot blade through a slit valve in a sidewall of the chamber (not shown). Pedestal 18 is moveable vertically by means of a motor 20. Substrate 16 is brought into the chamber when pedestal 18 is in a first position 13 opposite the slit valve. At position 13, substrate 16 is supported initially by a set of pins 22 that pass through and are coupled to susceptor 18. Pins 22 are driven by a single motor assembly.

As the pedestal is brought to a processing position 32 opposite gas distribution manifold 14 as shown by the dotted line, pins 22 sink into pedestal 18 and substrate 16 is deposited onto the pedestal. Once positioned on pedestal 18, substrate 16 is affixed to the pedestal by a vacuum clamping system (shown in FIG. 1B as grooves 50).

As it moves upward toward processing position 32, substrate 16 contacts purge guide 54, which centers the substrate on the pedestal. Edge purge gases 23 are flowed through purge guide 54 across the edge of substrate 16 to prevent deposition gases from contacting the edge and backside of the substrate. Purge gases 25 are also flowed around heater/pedestal 18 to minimize deposition on an around the heater/pedestal. These purge gases are supplied from a purge line (FIG. 1A, 24) and are also employed to protect stainless steel bellows 26 from damage by corrosive gases introduced into the chamber during processing.

Deposition and carrier gases are supplied to a deposition zone of the chamber through gas lines 19 to manifold 14 in response to the control of valves 17. During processing, gas supplied to manifold 14 is distributed uniformly across the surface of the substrate as shown by arrows 27. Spent processing gases and by-product gases are exhausted from the chamber by means of exhaust system 36. The rate at which gases are released through exhaust system 36 into an exhaust line is controlled by a throttle valve (not shown). During deposition, a second purge gas through gas channels in the susceptor (not shown) and feed line 38 feeds purge gas against the edge of wafer 16 as previously described. An RF power supply 48 can be coupled to manifold 14 to provide for plasma-enhanced CVD (PECVD) cleaning of the chamber.

The throttle valve, gas supply valves 17, motor 20, resistive heater coupled to susceptor 18, RF power supply 48 and other aspects of CVD system 10 are controlled by a processor 42 over control lines 44 (only some of which are shown). Processor 42 operates under the control of a computer program stored in a computer-readable medium such as a memory 46. The computer program dictates the temperature, chamber pressure, timing, mixture of gases, RF power levels, susceptor position, and other parameters of a particular process.

In a preferred embodiment, the system controller includes a hard disk drive (memory 46 a floppy disk drive and a processor 42. The processor contains a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

System controller 42 controls all of the activities of the CVD machine. The system controller executes system control software, which is a computer program stored in a computer-readable medium such as a memory 46. Preferably, memory 46 is a hard disk drive, but memory 46 may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to operate controller 42.

Figure 1C:
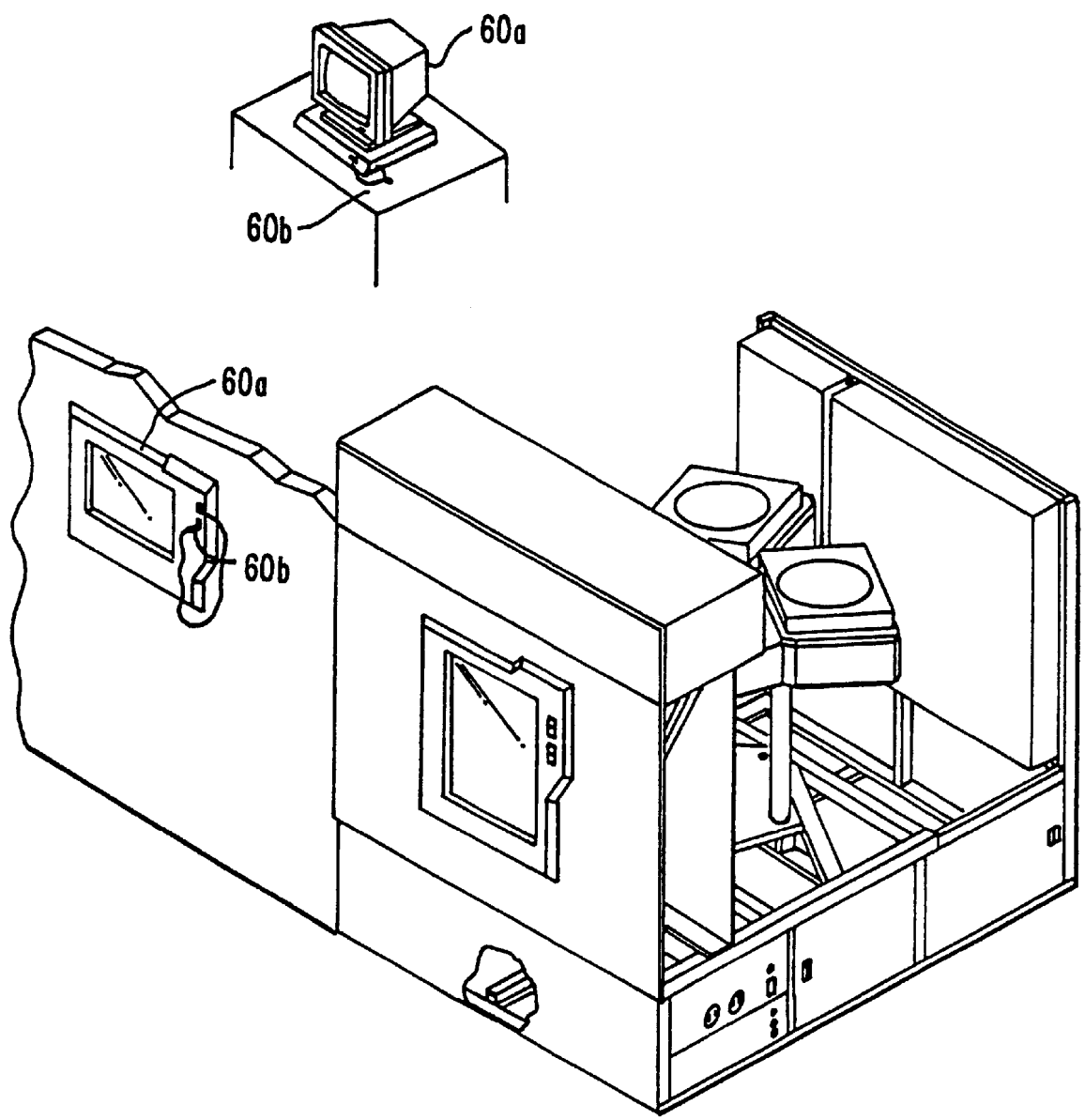
FIG. 1C is a simplified diagram of system monitor and CVD system 100 in a multi-chamber system, which may include one or more chambers.

The interface between a user and controller 42 is via a CRT monitor 60a and light pen 60b, shown in FIG. 1C which is a simplified diagram of the system monitor and CVD system 10 in a substrate processing system, which may include one or more chambers. In the preferred embodiment two monitors 60a are used, one mounted in the clean room wall for the operators and the other behind the wall for the service technicians. The monitors 60a simultaneously display the same information, but only one light pen 60b is enabled. A light sensor in the tip of light pen 60b detects light emitted by CRT display. To select a particular screen or function, the operator touches a designated area of the display screen and pushes the button on the pen 60b. The touched area changes its highlighted color, or a new menu or screen is displayed, confirming communication between the light pen and the display screen. Other devices, such as a keyboard, mouse, or other pointing or communication device, may be used instead of or in addition to light pen 60b to allow the user to communicate with controller 42.

The process for depositing the film can be implemented using a computer program product that is executed by controller 42. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Windows™ library routines. To execute the linked, compiled object code the system user invokes the object code, causing the computer system to load the code in memory. The CPU then reads and executes the code to perform the tasks identified in the program.

Figure 1D:
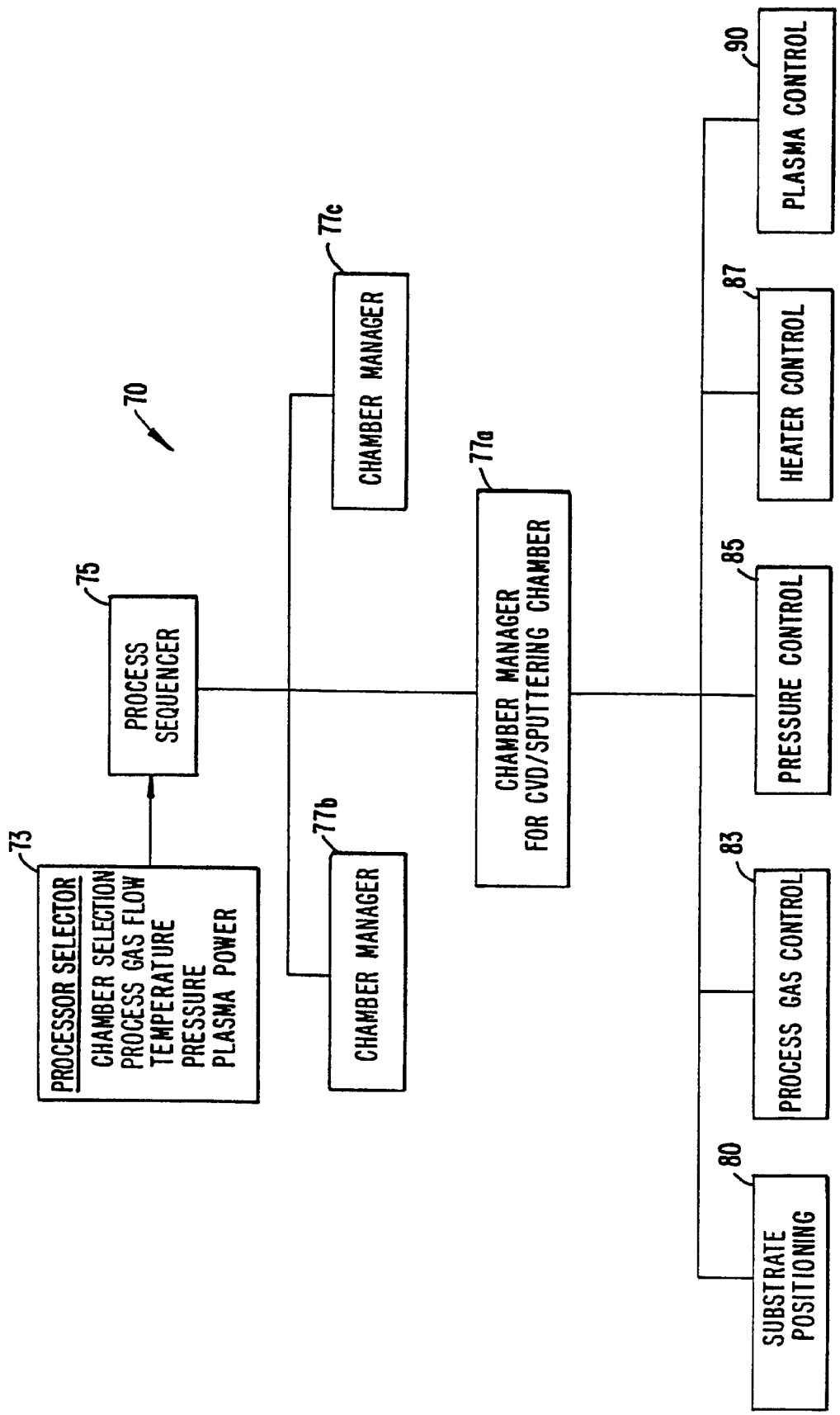
FIG. 1D shows an illustrative block diagram of the hierarchical control structure of the system control software, computer program 170, according to a specific embodiment.

FIG. 1D is an illustrative block diagram of the hierarchical control structure of the system control software, computer program 70, according to a specific embodiment. Using the light pen interface, a user enters a process set number and process chamber number into a process selector subroutine 73 in response to menus or screens displayed on the CRT monitor. The process sets are predetermined sets of process parameters necessary to carry out specified processes, and are identified by predefined set numbers. The process selector subroutine 73 identifies (i) the desired process chamber and (ii) the desired set of process parameters needed to operate the process chamber for performing the desired process. The process parameters for performing a specific process relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe, and are entered utilizing the light pen/CRT monitor interface.

The signals for monitoring the process are provided by the analog and digital input boards of the system controller, and the signals for controlling the process are output on the analog and digital output boards of CVD system 10.

A process sequencer subroutine 75 comprises program code for accepting the identified process chamber and set of process parameters from the process selector subroutine 73, and for controlling operation of the various process chambers. Multiple users can enter process set numbers and process chamber numbers, or a user can enter multiple process set numbers and process chamber numbers, so the sequencer subroutine 75 operates to schedule the selected processes in the desired sequence. Preferably, the sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 75 takes into consideration the present condition of the process chamber being used in comparison with the desired process conditions for a selected process, or the "age" of each particular user entered request, or any other relevant factor a system programmer desires to include for determining scheduling priorities.

Once the sequencer subroutine 75 determines which process chamber and process set combination is going to be executed next, the sequencer subroutine 75 initiates execution of the process set by passing the particular process set parameters to a chamber manager subroutine 77a–c, which controls multiple processing tasks in a process chamber 12 according to the process set determined by the sequencer subroutine 75. For example, the chamber manager subroutine 77a comprises program code for controlling CVD process operations in the process chamber 12. The chamber manager subroutine 77 also controls execution of various chamber component subroutines that control operation of the chamber components necessary to carry out the selected process set. Examples of chamber component subroutines are substrate positioning subroutine 80, process gas control subroutine 83, pressure control subroutine 85, heater control subroutine 87 and plasma control subroutine 90 in some embodiments. A person having ordinary skill in the art will readily recognize that other chamber control subroutines can be included depending on what processes are to be performed in the process chamber 12. In operation, the chamber manager subroutine 77a selectively schedules or calls the process component subroutines in accordance with the particular process set being executed. The chamber manager subroutine 77a schedules the process component subroutines much like the sequencer subroutine 75 schedules which process chamber 12 and process set are to be executed next. Typically, the chamber manager subroutine 77a includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 1D. The substrate positioning subroutine 80 comprises program code for controlling chamber components that are used to load the substrate onto pedestal 18 and, optionally, to lift the substrate to a desired height in the chamber 12 to control the spacing between the substrate and the gas distribution manifold 14. When a substrate is loaded into the process chamber 12, pedestal 18 is lowered to receive the substrate, and thereafter, the pedestal 18 is raised to the desired height in the chamber, to maintain the substrate at a first distance or spacing from the gas distribution manifold during the CVD process. In operation, the substrate positioning subroutine 80 controls movement of pedestal 18 in response to process set parameters related to the support height that are transferred from the chamber manager subroutine 77a.

The process gas control subroutine 83 has program code for controlling process gas composition and flow rates. The process gas control subroutine 83 controls the open/close position of the safety shut-off valves, and also ramps up/down the mass flow controllers to obtain the desired gas flow rate. The process gas control subroutine 83 is invoked by the chamber manager subroutine 77a, as are all chamber component subroutines, and receives from the chamber manager subroutine process parameters related to the desired gas flow rates. Typically, the process gas control subroutine 83 operates by opening the gas supply lines and repeatedly (i) reading the necessary mass flow controllers, (ii) comparing the readings to the desired flow rates received from the chamber manager subroutine 77a, and (iii) adjusting the flow rates of the gas supply lines as necessary. Furthermore, the process gas control subroutine 83 includes steps to monitor the gas flow rates for unsafe rates and for activating the safety shut-off valves when an unsafe condition is detected.

In some processes, an inert gas such as helium or argon is flowed into the chamber 12 to stabilize the pressure in the chamber before reactive process gases are introduced. For these processes, the process gas control subroutine 83 is programmed to include steps that flow the inert gas into the chamber 12 for an amount of time necessary to stabilize the pressure in the chamber, and then the steps described above would be carried out.

The pressure control subroutine 85 comprises program code for controlling the pressure in the chamber 12 by regulating the size of the opening of the throttle valve in the exhaust system of the chamber. The size of the opening of the throttle valve is set to control the chamber pressure to the desired level in relation to the total process gas flow, size of the process chamber, and pumping setpoint pressure for the exhaust system. When the pressure control subroutine 85 is invoked, the desired, or target, pressure level is received as a parameter from the chamber manager subroutine 77a. The pressure control subroutine 85 operates to measure the pressure in the chamber 12 by reading one or more conventional pressure manometers connected to the chamber, to compare the measure value(s) to the target pressure, to obtain PID (proportional, integral, and differential) values from a stored pressure table corresponding to the target pressure, and to adjust the throttle valve according to the PID values obtained from the pressure table. Alternatively, the pressure control subroutine 85 can be written to open or close the throttle valve to a particular opening size to regulate the chamber 12 to the desired pressure.

The heater control subroutine 87 comprises program code for controlling the current to a heating unit that is used to heat the substrate 20. The heater control subroutine 87 is also invoked by the chamber manager subroutine 77a and receives a target, or set-point, temperature parameter. The heater control subroutine 87 measures the temperature by measuring voltage output of a thermocouple located in pedestal 12, comparing the measured temperature to the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. When an embedded loop is used to heat susceptor 18 the heater control subroutine 87 gradually controls a ramp up/down of current applied to the loop. Additionally, a built-in fail-safe mode can be included to detect process safety compliance, and can shut down operation of the heating unit if the process chamber 12 is not properly set up.

In some embodiments, chamber 12 is outfitted with an RF power supply 48 that is used for chamber cleaning or other operations. When a chamber cleaning plasma process is employed, plasma control subroutine 90 comprises program code for setting the frequency RF power levels applied to the process electrodes in the chamber 12. Similar to the previously described chamber component subroutines, the plasma control subroutine 90 is invoked by the chamber manager subroutine 77a.

The above CVD system description is mainly for illustrative purposes and should not be considered as limiting the scope of the present invention. Variations of the above described system, such as variations of pedestal design, heater design, location of RF power connections and others are possible. The method for depositing a tungsten layer according to the present invention is not limited to any specific processing apparatus.

III. Depositing Tungsten Films

Figure 2:
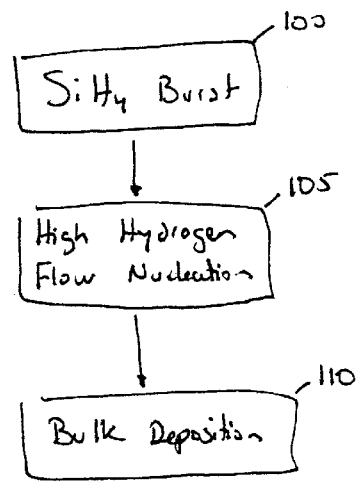
FIG. 2 is a flowchart illustrating the steps of one embodiment of the present invention.

The method of the present invention may be employed to deposit improved tungsten films in a substrate processing chamber, such as the exemplary CVD chamber described above. FIG. 2 illustrates one embodiment of the invention that is used to deposit a tungsten film over a semiconductor substrate. The process is for exemplary purposes and is not intended to limit the scope of the claims of the present invention. Where applicable, reference numbers in the description below are used to refer to appropriate components of the exemplary chamber of FIGS. 1A–1D. This process may be implemented and controlled using a computer program stored in the memory 46 of CVD system 10.

The embodiment of the invention shown in FIG. 2 includes a silane soak step 100 in which a silane gas, such as dichlorosilane ($SiCl_2H_2$) or monosilane ($SiH_4$), and a carrier gas, such as argon and hydrogen, are flowed into chamber 12 for between 5 and 30 seconds to provide silane adsorption on the TiN surface before nucleation. In one particular embodiment, silane soak step 100 flows 75 sccm of $SiH_4$ into chamber 12 along with 500 sccm of $H_2$ and 1000 sccm of argon for 10 seconds at a chamber pressure of 90 Torr.

After completion of silane soak step 100, a nucleation step 105 is performed. Nucleation step 105 flows a process gas including $WF_6$, $SiH_4$, $H_2$, argon and optionally nitrogen into chamber 12 to grow a thin tungsten layer that acts as a growth site for subsequent tungsten film. Generally the nucleation gas is flowed into the chamber for between 4 to 60 seconds. During this time the pedestal temperature is set to between 350 and 475° C. and chamber pressure is set to a level between 1 and 50 Torr. As discussed in more detail below, the present inventors have discovered that flowing $H_2$ and argon into chamber 12 in a ratio of at least 1.5:1 ($H_2$:Ar) and setting gas flows such that the partial pressure of $WF_6$ is less than or equal to 0.5 Torr during step 105 results in less fluorine being incorporated into the tungsten layer than would result if lower $H_2$:Ar ratios were employed. Lower levels of fluorine in the tungsten layer, in turn, results in improved electrical characteristics of transistors formed on substrate 16.

Bulk deposition step 110 then completes deposition of the tungsten layer by flowing a process gas including $WF_6$, $H_2$, argon and optionally $N_2$ into chamber 12. Chamber pressure during step 110 is maintained between 50 and 760 Torr while the pedestal temperature is set to between 350 and 475° C. The length of the bulk deposition step depends on the desired thickness of the tungsten film. While not necessary in all embodiments, some embodiments of the invention also employ a $H_2$:Ar flow ratio of at least 1.5:1 in bulk deposition step 110.

Tungsten films deposited according to the above process can achieve void free (100% step coverage) of HAR, narrow diameter vias (e.g., 0.25 μm vias having an aspect ratio of 8:1). The films also have reduced fluorine content as compared to films deposited using a $H_2$:Ar flow ratio of less than 1.5:1 in the nucleation step. Minimizing fluorine content in the tungsten film is particularly useful since fluorine from the tungsten film can diffuse into a neighboring titanium nitride and/or titanium layer thereby increasing the resistance of those layers.

Figure 3A:
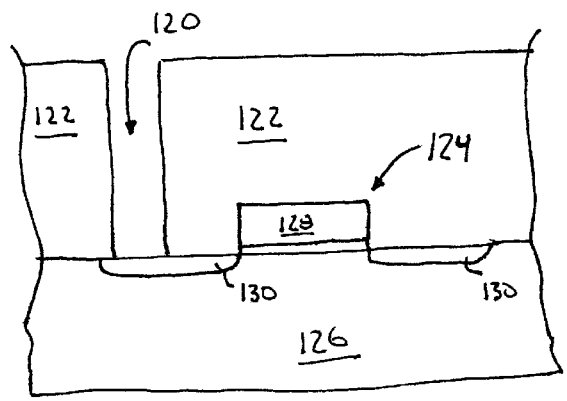
FIG. 3A is a simplified cross-sectional view of a HAR contact gap for which embodiments of the present invention may be used to fill.
Figure 3B:
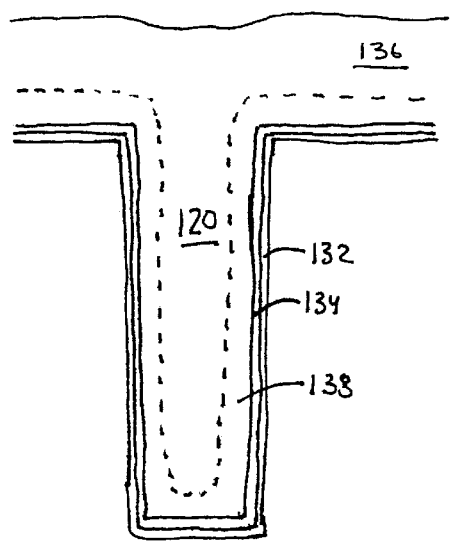
FIG. 3B is an enlarged view of the gap shown in FIG. 3A partially filled with titanium and titanium nitride layers.

In order to better appreciate the fluorine diffusion problem, reference is made to FIGS. 3A and 3B, which are simplified cross-sectional views of an integrated circuit having a tungsten contact. In FIG. 3A, an HAR gap 120 has been etched in a dielectric layer 122, such as a borophosphorus silicate glass (BPSG) layer, deposited over a transistor 124 formed in a substrate 126. Transistor 124 includes a gate 128 and source/drain regions 130. Electrical contact is made to source/drain regions 130 in HAR gap 120 by depositing a W/TiN/Ti film stack as is known to those of ordinary skill in the art. Because of the shrinking transistor size and the use of structures such as tall, three dimensional capacitors in dynamic access memories (DRAMs), some HAR gaps 120 in modem integrated circuits have increased depth to diameter (or aspect ratios) measurements than such gaps did in previous generations of integrated circuits.

FIG. 3B is an enlarged view of HAR gap 120 shown in FIG. 3A. As shown in FIG. 3B, deposition of a titanium contact layer 132 and a titanium nitride diffusion barrier layer 134 precedes deposition of a tungsten film within the gap and further narrows the opening of gap 120 prior to tungsten deposition. Fluorine from a CVD tungsten film 136 deposited within gap 120 can diffuse into the titanium nitride layer 134 and titanium contact layer 132 during deposition of the tungsten layer or during subsequent processing. Such fluorine diffusion may increase the resistivity of the TiN/Ti layers and thereby increase the resistance of the contact. The inventors have found that even a small increase in fluorine concentration in the TiN/Ti layers can have a significant impact on the electrical characteristics of the contact. This in turn may result in an adverse impact on device yield because of failures due to the high contact resistance. For example, in a DRAM circuit the increased resistance may result in an overall decrease in circuit speed such that the timing requirements for accessing or refreshing individual cells cannot be met. The inventors have also found that because of the diffusivity of fluorine in tungsten (measured to be approximately $4 \times 10^{-4}$ cm$^2$/sec at 425° C.) the majority of fluorine that migrates to the TiN/Ti layers comes from tungsten nucleation layer 138.

Realizing the significance that reducing fluorine concentration in the tungsten film may have on device performance, the inventors developed the method discussed above with respect to FIG. 2 to minimize fluorine incorporation into the tungsten film and thereby minimize the source of fluorine diffusion into the titanium nitride/titanium layers. One way to reduce fluorine levels in the tungsten film is to employ a $WF_6$ to $SiH_4$ ratio of around 1:1. Tungsten film step coverage is adversely affected at $WF_6:SiH_4$ ratios this low, however, and the deposited film may become silicon-rich and exhibit low reflectivity. For these and other reason it is preferred that the $WF_6:SiH_4$ ratio be between about 1.5:1 and 4:1 and preferably be between 2:1 and 3:1 inclusive.

The inventors thus developed a different method of reducing fluorine content. This goal was accomplished by increasing the flow of molecular hydrogen used during the deposition of the tungsten nucleation layer. In one embodiment, the ratio of $H_2$ to argon is at least 1.5:1 while the partial pressure of $WF_6$ is less than or equal to 0.5 Torr. It is desirable to have a total gas flow of $H_2$ and Ar sufficiently high so that $WF_6$ partial pressure is 0.5 Torr or less in order to achieve high uniformity and reduce fluorine attack on the underlying layer during the tungsten deposition process as well as to reduce the fluorine attack on chamber components. In other embodiments, the ratio of $H_2$ to Argon is preferably at least 2:1.

The inventors unexpectedly discovered that when a tungsten nucleation layer was deposited over a TiN/Ti film stack under these conditions, the contact resistance was improved as compared to the contact resistance measured when the tungsten nucleation layer was deposited at lower $H_2$ to Ar ratios. The inventors discovered this to be the case under all tested deposition temperatures (from 400° C. to 475° C.) but noticed that contact resistance decreased the most at the higher deposition temperatures.

In order to reach the above conclusions, the inventors ran numerous tests and studies comparing the fluorine concentration of W/TiN/Ti film stacks having tungsten layers deposited with and without the benefits of the present invention. One of these tests, set forth in Table 1 and described below, was performed on 200 mm silicon (100) wafers having a W/TiN/Ti film stack deposited over a 3000 Å thermally grown oxide film grown thereon. The W/TiN/Ti film stack was formed as follows. First, the oxidized wafers were loaded into an Applied Materials Endura™ cluster tool and deposited with 750 Å of titanium by biased sputtering, followed by 80 Å of TiN by metalorganic chemical vapor deposition (MOC.VD). The source gas for TiN was tetrakis demethylamido titanium (TDMat), and the film was plasma treated subject to a plasma densification treatment using 250 W of 13.56 MHz radio frequency to form a plasma from $N_2$ to density the film and reduce the concentration of organic contaminants. After plasma treatment, the TiN film was approximately 50 Å thick. The wafers were then loaded into an Applied Materials WxZ Centura™ tool for tungsten deposition. Prior to tungsten nucleation film deposition, the wafers were exposed to an in situ $SiH_4$ treatment step resulting in $SiH_4$ adsorption on the TiN surface. This $SiH_4$ exposure provides for a more homogeneous tungsten deposition, as previously described. Nucleation film deposition was performed at a pressure of 30 Torr and a wafer pedestal temperature of 475° C. (wafer temperature approximately 10–15° C. less). The $WF_6$ and $SiH_4$ flows were 30 and 10 standard cubic centimeters per minute (sccm), respectively. Deposition times for the wafers shown were adjusted to produce approximately 500 Å of tungsten nucleation film on all wafers.

TABLE 1

EXPERIMENTS VARYING THE RATIO OF $H_2$ FLOW TO AR FLOW

| Wafer | $WF_6:SiH_4$ (sccm) | $H_2$ (sccm) | Ar (sccm) | $H_2$/Ar ratio | Total $H_2$/Ar flow (sccm) | $WF_6$ partial pressure (Torr) |
|---|---|---|---|---|---|---|
| 1 | 30:10 | 500 | 2500 | .2:1 | 3000 | 0.3 |
| 2 | 30:10 | 1000 | 2000 | .5:1 | 3000 | 0.3 |
| 3 | 30:10 | 1500 | 1500 | 1:1 | 3000 | 0.3 |
| 4 | 30:10 | 2000 | 1000 | 2:1 | 3000 | 0.3 |
| 5 | 30:10 | 2250 | 750 | 3:1 | 3000 | 0.3 |
| 6 | 30:10 | 2500 | 500 | 5:1 | 3000 | 0.3 |

As shown in Table 1, these experiments vared the $H_2$:Ar flow ratio from 0.2:1 to 5:1 while the total $H_2$+Ar flow was kept at 3000 sccm during deposition of the tungste nucleation layer. Table 1 filter shows that in all cases, the flow ratio of combined $H_2$ and Ar:$WF_6$ was at least 100:1. After deposition of the tungsten layer, the fluorine concentration in the TiN/Ti film stack was measured. The results of these measurements are shown in FIG. 4.

Figure 4:
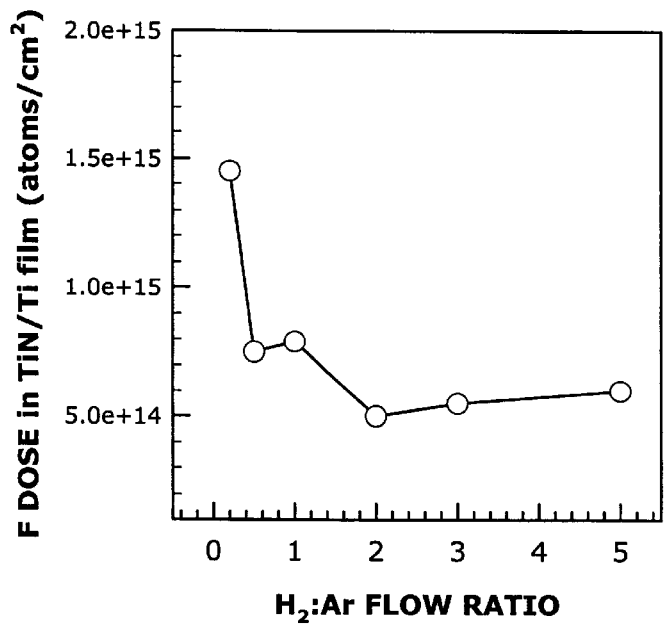
FIG. 4 is a chart illustrating the effect of the hydrogen:argon flow ratio used during deposition of a tungsten nucleation layer on the fluorine concentration of a W/TiN/Ti film stack.

As shown in FIG. 4, the fluorine dose in the TiN/Ti film stack over which the tungsten layers detailed in Table 1 is deposited decreases dramatically as an initial mount of hydrogen is included in the deposition gas, then increases somewhat at a ratio of 1:1 and decreases again as the $H_2$:Ar flow ratio reaches about 1.5:1. The fluorine dose levels obtained at $H_2$:Ar flow levels of 1.5:1 and higher result in significantly improved electrical characteristics of the TiN/Ti contact structure and higher product yield. As used herein, fluorine dose is calculated from a SIMS plot by integrating the area beneath the F concentration curve as is known to those of skill in the art. The actual fluorine dose is thus specific to the chosen TiN/Ti film stack, nucleation film thickness, and other variables.

Figure 5A:
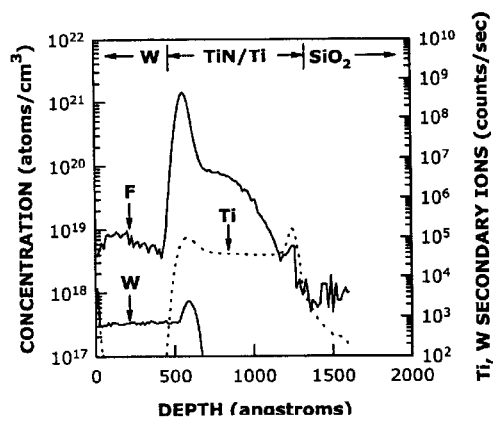
FIGS. 5A and 5B are SIMS depth profiles comparing the fluorine concentration in W/TiN/Ti film stacks having tungsten layers deposited with and without the benefits of deposition techniques according to the embodiments of the present invention.
Figure 5B:
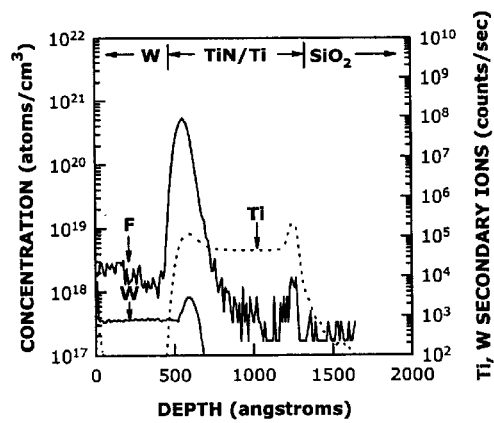

FIGS. 5A and 5B show representative SIMS depth profiles from wafers 1 and 4 in the Table 1 set of experiments. Depth profile analysis for these figures was done by sputtering SIMS using quadrapole spectrometer analysis. Sputtering was done by 3 keV C.s$^+$beam. Film thickness was checked by cross sectional scanning electron microscopy (SEM). As evident from comparison of FIG. 5A to FIG. 5B, considerably less fluorine is incorporated into the TiN/Ti film stack represented in FIG. 5B. Step coverage of tungsten nucleation films using the deposition conditions for wafers 4–6 in Table 1 was checked on wafers with 0.3 µm diameter vias etched into 2.4 µm thick oxide films (8:1 aspect ratio) with 50 Å TiN/250 Å Ti film stacks and determined to be 100%.

Other experiments performed by the inventors confirmed these results. From some of these experiments the inventors were also able to determine that increasing the total $H_2$+Ar flows above 3000 sccm resulted in further improvements to fluorine dose. For example, improvements were found in a 30 sccm WF$_6$, 15 sccm SiH$_4$, 4:1 H$_2$:Ar flow ratio process when total H$_2$+Ar flow was increased to 5000 sccm and to 10,000 sccm. Specifically, the concentration of fluorine in the tungsten nucleation film is reduced by half when 10,000 sccm of H$_2$+Ar is flowed ($2 \times 10^{19}$ atoms/cm$^3$) compared with 2,500 sccm ($4 \times 10^{19}$ atoms/cm$^3$). Fluorine penetration into the TiN/Ti films shows similar decreases with increasing H$_2$+Ar flows.

In summary, based on the above test results and other work performed by the inventors, the inventors have determine that fluorine content in a TiN/Ti film stack underlying a tungsten layer can be reduced by setting H$_2$ and Ar flow so that the ratio of H$_2$:Ar is at least 1.5:1 and the partial pressure of WF$_6$ is less than or equal to 0.5 Torr. The reduction is more pronounced at higher tungsten deposition temperatures such as 475° C. but can still have a noticeable impact on device yield at lower tungsten deposition temperatures such as 400° C.

The process parameters set forth above with respect to the preferred embodiments are optimized for one particular deposition process run in a resistively heated WxZ chamber outfitted for 200 mm wafers and manufactured by Applied Materials. In addition to varying processing parameters described above to deposit tungsten layers according to specific applications, a person of ordinary skill in the art will recognize that these preferred parameters are in part chamber specific and will vary if chambers of other design and/or volume are employed. It should also be noted that various purge gases may be flowed into the substrate processing chamber during deposition of the tungsten layer as is known to those of skill in the art. Such purge gases may include argon but they are not intended to be calculated into the 1.5:1 H$_2$:Ar ratio set forth above. Instead, that ratio is calculated based on deposition and carrier gases; it does not include purge gases.

The parameters listed in the above preferred processes and the above-described experiments should not be limiting to the claims as described herein. One of ordinary skill in the art can also use parameters and conditions other than those described with respect to the preferred embodiment. As such, the above description is illustrative and not restrictive. For example, while not described above, a person of ordinary skill in the art will appreciate that various intermediary steps can be included before and after each of steps 100, 105 and 110 to optimize film characteristics such as uniformity, reflectivity and film stress. For example, substrate 16 can be heated to a desired temperature in the presence of an inert gas prior to step 100. Similarly, chamber 12 can be brought to the desired pressure level of step 105 or step 110 while flowing argon and H$_2$ into the chamber without flowing WF$_6$. Also, WF$_6$ can be purged from chamber 12 after the bulk deposition step by a flow of argon and H$_2$. Also, other process temperature and pressure values and other gas flow rates can be employed.

Similarly, other variations in a tungsten deposition process can be made without departing from the scope of the invention. For example, some embodiments of the present invention do not include silane soak step 100. Also, other embodiments may include a multiple step nucleation process in which one step deposits a tungsten nucleation film as described above but not all steps. The scope of the invention should, therefore, be determined not with reference to the above description, but instead should be determined with reference to the appended claims along with their full scope of equivalents.

What is claimed is:

1. A chemical vapor deposition method for depositing a tungsten film on a substrate disposed in a substrate processing chamber, said method comprising:

flowing a first process gas comprising tungsten hexafluoride, a silane gas, molecular hydrogen and argon into said substrate processing chamber to deposit a first layer of tungsten, wherein a flow ratio of molecular hydrogen to argon is at least 1.5:1, a flow ratio of combined molecular hydrogen and argon to tungsten hexafluoride in said first process gas is at least 100:1, and a partial pressure of said tungsten hexafluoride is less tan or equal to 0.5 Torr; and flowing a second process gas comprising tungsten hexafluoride and a reduction agent into said substrate processing chamber to deposit a second layer of tungsten on said first layer.

2. The method of claim 1 wherein said first layer of tungsten is deposited over a titanium nitride layer which is deposited over a titanium layer.

3. The method of claim 2 wherein said titanium nitride layer is less than or equal to 80 Å thick.

4. The method of claim 2 wherein said tungsten film is part of a via or contact within an integrated circuit.

5. The method of claim 4 wherein a diameter of said via or contact is 0.25 microns or less.

6. The method of claim 1 wherein said silane gas is monosilane.

7. The method of claim 1 wherein a flow ratio of tungsten hexafluoride to monosilane is between 1.5:1 and 4:1 inclusive.

8. The method of claim 1 wherein said first layer of tungsten is deposited at a pedestal temperature of at least 450° C.

9. The method of claim 1 wherein a flow ratio of WF$_6$:SiH$_4$ is between about 2:1–3:1.

10. A chemical vapor deposition method for depositing a tungsten film on a substrate disposed in a substrate processing chamber, said method comprising:

flowing a first process gas consisting essentially of tungsten hexafluoride, silane, molecular hydrogen and argon into said substrate processing chamber to deposit a first layer of tungsten, wherein a flow ratio of molecular hydrogen to argon is at least 1.5:1, a flow ratio of combined molecular hydrogen and argon to tungsten hxafluoride in said first process gas is at least 100:1, and a partial pressure of tungsten hefuoride is less the or equal to 0.5 Torn; and flowing a second process gas comprising tungsten hexafluoride, molecular hydrogen and argon into said substrate processing chamber to deposit a second layer of tungste on said first layer.

11. The method of claim 10 wherein said second process gas consists essentially of tungsten hexafluoride, molecular hydrogen and argon.

12. The method of claim 10 wherein said second process gas consists essentially of tungsten hexafluoride, molecular hydrogen, argon and nitrogen.

13. The method of claim 10 wherein a flow ratio of tungsten hexafluoride to monosilane is between 1.5:1 and 4:1 inclusive.

14. The method of claim 10 wherein said first layer of tungsten is deposited over a titanium nitride layer which is deposited over a titanium layer.

15. The method of claim 14 wherein said titanium nitride layer is less than or equal to 80 Å thick.

16. The method of claim 10 wherein a diameter of said via or contact is 0.25 microns or less.

17. The method of claim 10 wherein a flow ratio of WF$_6$:SiH$_4$ is between about 2:1–3:1.

* * * * *